US012660202B2

(12) United States Patent
Yu

(10) Patent No.: US 12,660,202 B2
(45) Date of Patent: *Jun. 16, 2026

(54) CIRCUIT AND METHOD TO ENHANCE EFFICIENCY OF MEMORY

(71) Applicant: TAIWAN SEMICONDUCTOR MANUFACTURING COMPANY LTD., Hsinchu (TW)

(72) Inventor: Hung-Chang Yu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 92 days.

This patent is subject to a terminal disclaimer.

(21) Appl. No.: 18/786,588

(22) Filed: Jul. 29, 2024

(65) Prior Publication Data

US 2024/0389354 A1     Nov. 21, 2024

Related U.S. Application Data

(60) Continuation of application No. 18/361,897, filed on Jul. 30, 2023, now Pat. No. 12,167,613, which is a
(Continued)

(51) Int. Cl.
*G11C 11/16* (2006.01)
*G11C 11/15* (2006.01)
(Continued)

(52) U.S. Cl.
CPC .............. *H10B 61/20* (2023.02); *G11C 11/15* (2013.01); *G11C 11/161* (2013.01);
(Continued)

(58) Field of Classification Search
CPC ....................................................... G11C 7/04
See application file for complete search history.

(56) References Cited

U.S. PATENT DOCUMENTS 6,160,391 A     12/2000  Banba
6,501,256 B1    12/2002  Jaussi et al.
(Continued)

FOREIGN PATENT DOCUMENTS

CN      101561688 A     10/2009
CN      101609346 A     12/2009
(Continued)

OTHER PUBLICATIONS

U.S. Pat. No. 7,863,883B2 is the US counterpart of CN101561688A.
(Continued)

*Primary Examiner* — Douglas King
(74) *Attorney, Agent, or Firm* — WPAT LAW; Anthony King

(57) ABSTRACT

A semiconductor device includes: a memory array; a modulation circuit including a first resistive element, a second resistive element and a third resistive element; a regulator including a transistor; and a controller configured to: determine an operation mode of the memory array; generate a first regulated voltage at a drain terminal of the transistor, wherein the first regulated voltage corresponds to a positive temperature coefficient, a negative temperature coefficient or a zero temperature coefficient according to a first resistance ratio between the first resistive element and the second resistive element and a second resistance ratio between the second resistive element and the third resistive element; provide a first access voltage to the memory array in response to the first regulated voltage corresponding to the positive temperature coefficient; and provide a second access voltage to the memory array in response to the first regulated voltage corresponding to the negative temperature coefficient.

20 Claims, 8 Drawing Sheets

Related U.S. Application Data continuation of application No. 17/200,864, filed on Mar. 14, 2021, now Pat. No. 11,793,000, which is a division of application No. 16/245,857, filed on Jan. 11, 2019, now Pat. No. 10,950,658.

(60) Provisional application No. 62/734,487, filed on Sep. 21, 2018.

(51) Int. Cl.

| | | |
|---|---|---|
| *H10B 61/00* | (2023.01) | |
| *H10B 63/00* | (2023.01) | |
| *H10D 84/00* | (2025.01) | |

(52) U.S. Cl.
CPC ...... *G11C 11/1655* (2013.01); *G11C 11/1657* (2013.01); *H10B 61/00* (2023.02); *H10B 63/32* (2023.02); *H10D 84/206* (2025.01)

(56) References Cited

U.S. PATENT DOCUMENTS

| 9,715,937 | B1 | 7/2017 | Pang et al. |
|---|---|---|---|
| 10,386,879 | B2 | 8/2019 | Yen et al. |
| 12,167,613 | B2 * | 12/2024 | Yu ........................... H10B 61/00 |
| 2004/0245977 | A1 | 12/2004 | Tran |
| 2005/0078537 | A1 | 4/2005 | So et al. |
| 2006/0197585 | A1 | 9/2006 | Kim et al. |
| 2010/0177550 | A1 | 7/2010 | Hase et al. |
| 2015/0092497 | A1 | 4/2015 | Tsai |
| 2016/0197095 | A1 | 7/2016 | Yamane et al. |
| 2021/0151086 | A1 | 5/2021 | Lai et al. |

FOREIGN PATENT DOCUMENTS

| CN | 103792980 | A | 5/2014 |
|---|---|---|---|
| CN | 105807836 | A | 7/2016 |
| CN | 107799154 | A | 3/2018 |

OTHER PUBLICATIONS

English Abstract Translation of Foreign Reference CN101609346A.
US20140117967A1 is the US counterpart of CN103792980A.
U.S. Pat. No. 10,386,879B2 is the US counterpart of CN105807836A.
U.S. Pat. No. 10,566,069B2 is the US counterpart of CN107799154A.

* cited by examiner

CIRCUIT AND METHOD TO ENHANCE EFFICIENCY OF MEMORY

PRIORITY CLAIM AND CROSS-REFERENCE

This application is a continuation application of U.S. non-provisional Ser. No. 18/361,897 filed Jul. 30, 2023, which is a continuation application of U.S. non-provisional Ser. No. 17/200,864 filed Mar. 14, 2021, now U.S. Pat. No. 11,793,000 B2, which is a divisional application of U.S. patent application Ser. No. 16/245,857 filed on Jan. 11, 2019, now U.S. Pat. No. 10,950,658 B2, which claims the benefit of U.S. provisional application No. 62/734,487, filed on Sep. 21, 2018, the disclosures of which are hereby incorporated by reference in their entirety.

BACKGROUND

Semiconductor devices are used in integrated circuits for electronic applications, including cell phones and personal computing devices. A well-known semiconductor device is storage element, such as Magnetoresistive Random Access Memory (MRAM), Resistive Random Access Memory (RRAM), flash, and etc. A semiconductor storage element may be accessed during a write operation or a read operation via a word line.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
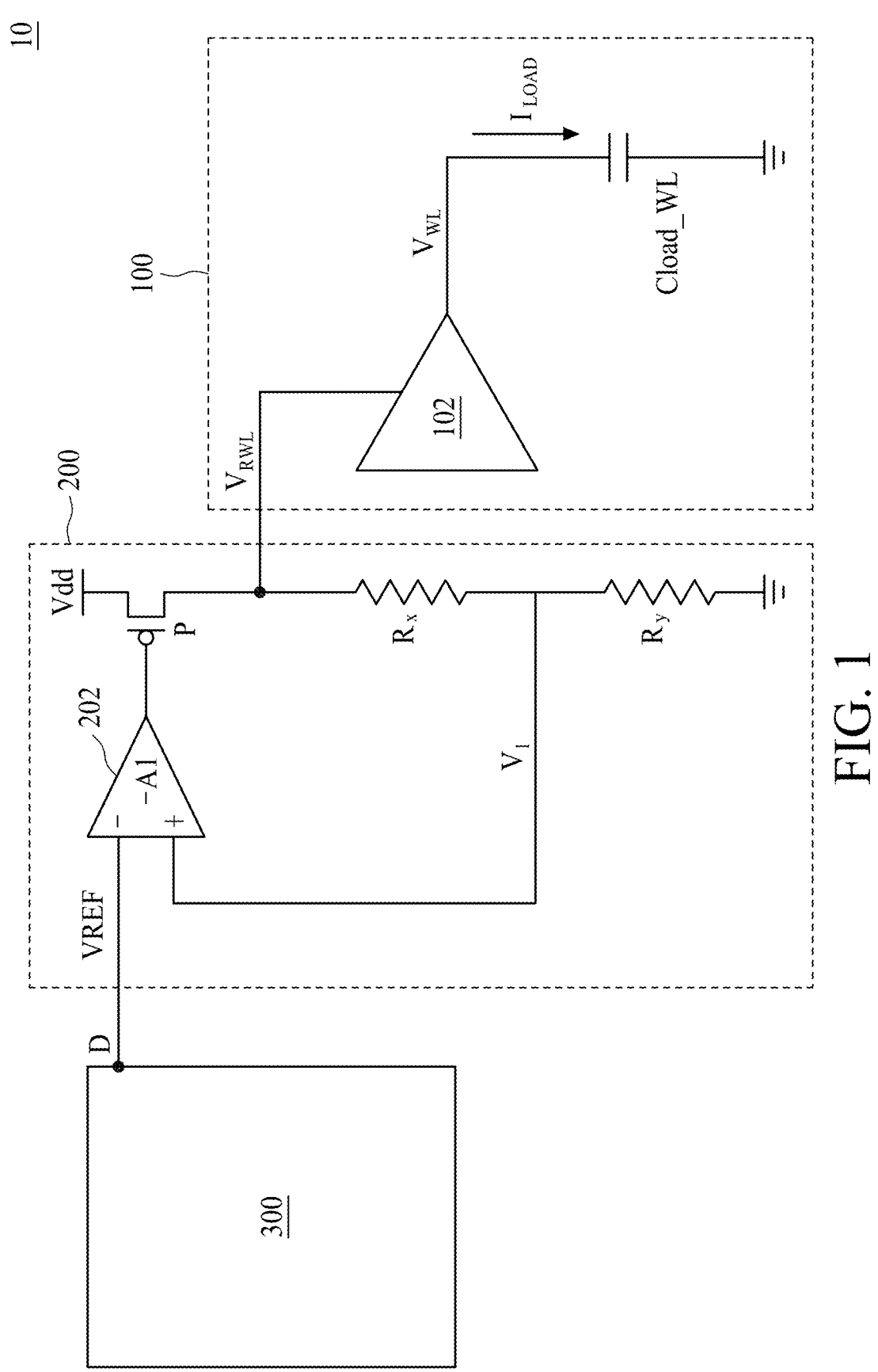
FIG. 1 is a diagram of a semiconductor device, in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In some existing memory devices, word lines need to be kept at a high voltage level to get ready for the worst case condition, which results in a relatively high power consumption. Moreover, the constant high voltage level may impact the reliability of memory devices that include metal-oxide-semiconductor field-effect transistors (MOSFETs), which have time-dependent dielectric breakdown (TDDB) property. Therefore, it may be desirable to have a circuit and a method to enhance efficiency of memory.

FIG. 1 is a diagram of a semiconductor device 10, in accordance with an embodiment of the present disclosure. Referring to FIG. 1, the semiconductor device 10 includes a memory array 100, a regulator 200 and a temperature coefficient modulation (TCM) circuit 300. For brevity, the memory array 100 is merely illustrated by a capacitor Cload_WL and a word line driver 102. The word line driver 102 may be used to drive a conductive path connected to a row of memory cells (not shown) in the memory array 100. The capacitor Cload_WL may be regarded as the loading of the conductive path connecting the word line diver 102. The memory array 100 may include a plurality word line drives for driving a plurality conductive paths connected to the memory cells in the memory array 100.

The TCM circuit 300 is configured to generate an output voltage $V_{REF}$ and provide the same at an output D to the regulator 200. The output voltage $V_{REF}$ is switched between a positive temperature coefficient and a negative temperature coefficient in response to the operation mode of the memory array 100. Specifically, the TCM circuit 300 generates a first output voltage $V_{REF}$ corresponding to a positive temperature coefficient during a read operation of the memory array 100, and generates a second output voltage $V_{REF}$ corresponding to a negative temperature coefficient during a write operation of the memory array 100. With the positive temperature coefficient, the first output voltage $V_{REF}$ increases as temperature increases, and vice versa. In contrast, with the negative temperature coefficient, the second output voltage $V_{REF}$ increases as temperature decreases, and vice versa. The TCM circuit 300 will be discussed in detail by referring to FIG. 3A.

The regulator 200 is configured to provide a first regulated voltage $V_{RWL}$ in response to the first output voltage $V_{REF}$ generated by the TCM circuit 300 during a read operation, and provide a second regulated voltage $V_{RWL}$ in response to the second output voltage $V_{REF}$ generated by the TCM circuit 300 during a write operation. In the present embodiment, the regulator 200 may be a linear regulator, for example, a low dropout (LDO) regulator. An LDO regulator may generate a steady output voltage close to the supply voltage of the LDO regulator. According to some embodiments, the regulator 200 includes a comparator 202, a transistor P and a voltage divider that includes resistive elements $R_x$ and $R_y$.

A first input terminal (inverting terminal) of the comparator 202 receives the output voltage $V_{REF}$ from the TCM circuit 300. A second input terminal (non-inverting terminal) of the comparator 202 is connected to a tap between the resistive elements $R_x$ and $R_y$. The comparator 202 in the present embodiment includes an operational amplifier having a gain of A1.

The transistor P includes a p-channel metal-oxide-semiconductor (PMOS) transistor. A gate of the transistor P receives an output of the comparator 202. A source of the transistor P receives a power voltage Vdd. A drain of the transistor P is connected to a first end of the resistive element $R_x$. The regulator 200 provides the regulated voltage $V_{RWL}$ at the drain terminal of the transistor P. The transistor P may act like an adjustable resistor: the more negative the gate becomes with respect to the source, the less the source-drain resistance becomes, resulting in a higher current flowing from Vdd towards the drain. As a result, the regulated voltage $V_{RWL}$ increases as the output voltage $V_{REF}$ increases, and vice versa.

The voltage divider is connected between the drain of the transistor P and a reference voltage level, ground. A second end of the resistive element $R_x$ is connected to the tap. A first end of the resistive element $R_y$ is also connected to the tap. A second end of the resistive element $R_y$ is connected to ground. A tap voltage V1 and the regulated voltage $V_{RWL}$ observe the following equation:

$$V1 = \left(\frac{Ry}{Rx+Ry}\right) \times V_{RWL}$$

The comparator 202 compares the voltage $V_{REF}$ against the tap voltage V1. As previously discussed, the regulated voltage $V_{RWL}$ increases as the output voltage $V_{REF}$ increases, and vice versa. Accordingly, the regulated voltage $V_{RWL}$ is also temperature-dependent as the output voltage $V_{REF}$. As a result, the regulated voltage $V_{RWL}$ is corresponding to a positive temperature coefficient during a read operation of the memory array 100, and is corresponding to a negative temperature coefficient during a write operation of the memory array 100.

The memory array 100 includes drivers and an array of memory cells. For convenience, only a memory cell represented by a capacitor Cload_WL and a word line driver 102 are shown. The word line driver 102 provides a voltage $V_{WL}$ on an associated word line in response to a regulated voltage $V_{RWL}$ from the regulator 200 to facilitate an access operation, represented by $I_{LOAD}$, of a selected cell Cload_WL. Similarly, the voltage $V_{WL}$ is also temperature-dependent as the regulated voltage $V_{RWL}$ and the output voltage $V_{REF}$. Moreover, the voltage $V_{WL}$ is corresponding to a positive temperature coefficient during a read operation of the memory array 100, and is corresponding to a negative temperature coefficient during a write operation of the memory array 100.

Figure 2:
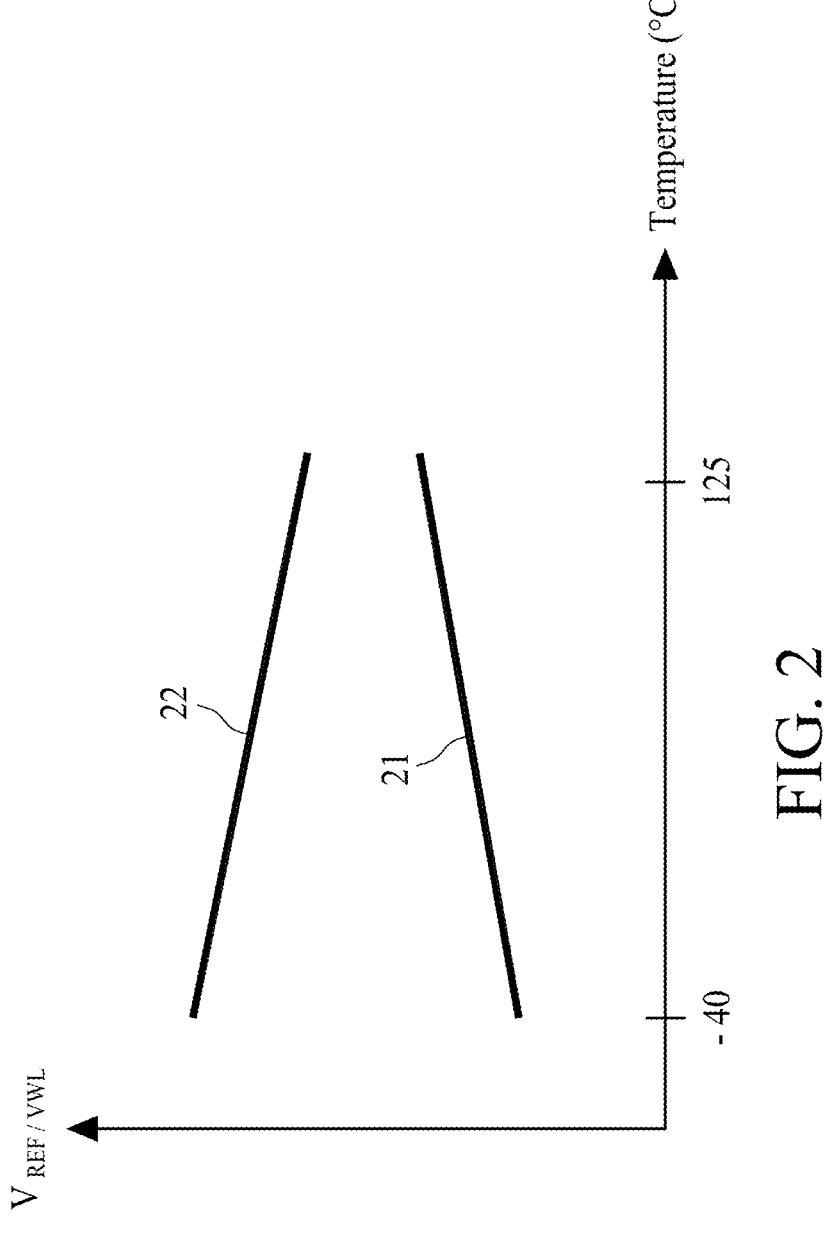
FIG. 2 is a diagram illustrating temperature dependency of an output voltage $V_{REF}$ of a temperature coefficient modulation (TCM) circuit shown in in FIG. 1, in accordance with some embodiments of the present disclosure.

FIG. 2 is a diagram illustrating temperature dependency of an output voltage $V_{REF}$ of the TCM circuit 300 shown in in FIG. 1, in accordance with some embodiments of the present disclosure. Referring to FIG. 2, line 21 and line 22 represent the output voltage $V_{REF}$ or the voltage $V_{WL}$ ($V_{REF}$/$V_{WL}$) at different temperatures (in Celsius degrees) during a read operation and a write operation, respectively, of a memory. Line 21 has a positive slope, which means that $V_{REF}$/$V_{WL}$ is corresponding to a positive temperature coefficient (PTC) during the read operation of the memory. Line 22 has a negative slope, which means that $V_{REF}$/$V_{WL}$ is corresponding to a negative temperature coefficient (NTC) during the write operation of the memory. As compared to existing approaches that keep the word line voltage $V_{WL}$ at a relatively high level, the semiconductor device 10 with $V_{REF}$/$V_{WL}$ switchable between PTC and NTC achieves an efficient power management. For example, the memory array 100 may include a spin-transfer-torque (STT) MRAM, which uses spin-aligned and polarized electrons to directly change the magnetic domains. Specifically, in an STT-MRAM, the orientation of a free magnetic layer in a magnetic tunnel junction may be modified or flipped using a spin-polarized current. The spin-polarized current may be created by passing a current through a fixed magnetic layer. Then, the electrons in the spin-polarized current may be spin-aligned and polarized by the fixed magnetic layer. When the spin-polarized current passes through the free magnetic layer, the angular momentum of the electrons in the spin-polarized current may change the orientation of the free magnetic layer. Two issues concerning temperature may arise during an access operation of an STT MRAM.

Regarding the read operation of the memory, the tunnel magneto resistance (TMR) is reduced at a high temperature, and thus read margin is reduced. Therefore, a higher output voltage $V_{REF}$ is required to increase the read margin at a higher temperature during the read operation of the memory. Accordingly, during the read operation, the TCM circuit 300 is arranged to generate the voltage $V_{REF}$ as well as $V_{WL}$ corresponding to positive temperature coefficient, i.e. the line 21 in FIG. 2, to increase the read margin when temperature changes to higher temperature. It is noted that Line 21 has a positive slope, thus the voltage $V_{REF}$ as well as $V_{WL}$ exhibits positive temperature coefficient.

As to the write operation of the memory, the MTJ of the memory is easily flipped at a high temperature, for example, 125° C., and becomes difficult to be flipped at a low temperature, for example, −40° C., because energy barrier (Eb) is reduced as temperature increases. Therefore, a higher output voltage $V_{REF}$ is required at a lower temperature during the write operation of the memory. Accordingly, during the write operation, the TCM circuit 300 is arranged to generate the voltage $V_{REF}$ as well as $V_{WL}$ corresponding to negative temperature coefficient, i.e. the line 22 in FIG. 2, to case the write operation when temperature changes to lower temperature. It is noted that Line 22 has a negative slope, thus the voltage $V_{REF}$ as well as $V_{WL}$ exhibits negative temperature coefficient.

Figure 3A:
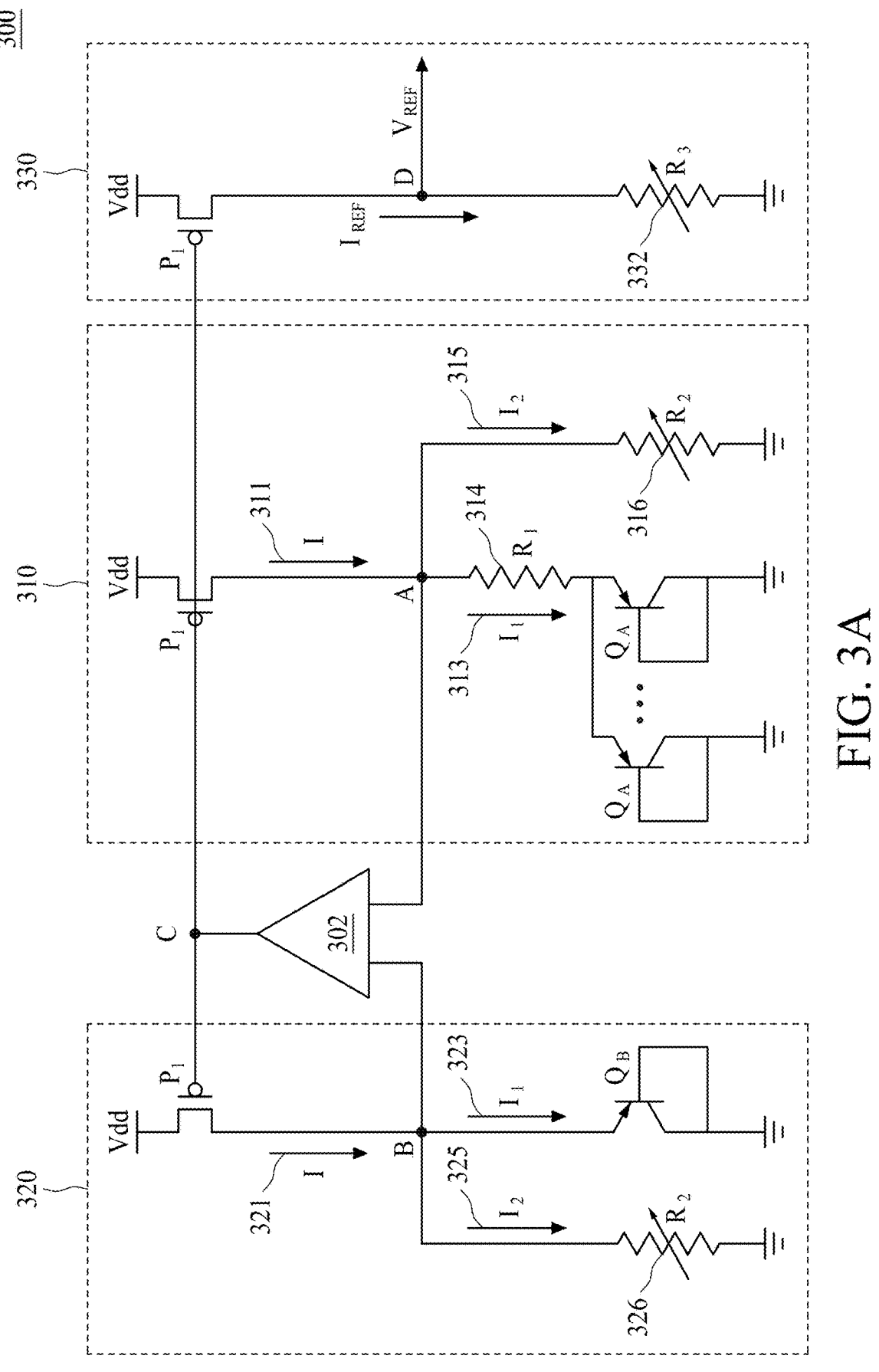
FIG. 3A is a circuit diagram of the TCM circuit shown in FIG. 1, in accordance with some embodiments of the present disclosure.

FIG. 3A is a circuit diagram of the TCM circuit 300 illustrated in FIG. 1, in accordance with some embodiments of the present disclosure. The TCM circuit 300 operates in a PTC mode and generates a PTC $V_{REF}$ in response to a read operation of the memory array 100, and operates in an NTC mode and generates an NTC $V_{REF}$ in response to a write operation of the memory array 100. Referring to FIG. 3A, the TCM circuit 300 includes a first portion 310, a second portion 320, an output stage 330 and a comparator 302.

The first portion 310 includes a transistor $P_1$, a first resistive element 314, a second resistive element 316 and multiple first transistors $Q_A$. In the present embodiment, the transistor $P_1$ includes a PMOS transistor. A gate of the transistor $P_1$ is connected to an output C of the comparator 302. A source of the transistor $P_1$ receives the supply voltage Vdd. A drain of the transistor $P_1$ is connected to a first node A, which in turn is connected to an input terminal of the comparator 302. The transistor $P_1$, when turned on, conducts a first current 311 having a magnitude I from Vdd towards the first node A. The first current 311 at the first node A is divided into a first branch current 313 having a first magnitude $I_1$ and a second branch current 315 having a second magnitude $I_2$. In an embodiment, the comparator 302 includes an operational amplifier. Ideally, no current flows into the input terminals of the comparator 302. As a result, I is equal to $I_1$ plus $I_2$.

The first branch current 313 flows through the first resistive element 314 towards the first transistors $Q_A$. In the present embodiment, each of the first transistors $Q_A$ includes a positive-negative-positive (pnp) type transistor. In addition, the number of the first transistors $Q_A$ is N, which is a natural number greater than one (1). In an embodiment, N is 7 or 8. A first end of the first resistive element 314 is connected to the first node A and receives the first branch current 313. A second end of the first resistive element 314 is connected to emitters of the first transistors $Q_A$. The base and collector of each of the first transistors $Q_A$ are connected together to ground. As a result, the emitter current of each of the first transistors $Q_A$ is $I_1/N$. The first resistive element 314 has a resistance $R_1$.

The second branch current 315 flows through the second resistive element 316. The second resistive element 316 is connected between the first node A and ground. The second resistive element 316 has a resistance $R_2$.

The second portion 320 is similar to the first portion 310 in circuit structure except that, for example, a single second transistor $Q_B$ replaces the N first transistors $Q_A$ and the first resistive element 314. The second transistor $Q_B$ has substantially the same electrical characteristics as the first transistors $Q_A$. In the present embodiment, the second transistor $Q_B$ also includes a pnp type transistor. An emitter of the second transistor $Q_B$ is connected to a second node B, which in turn is connected to another input terminal of the comparator 302. The base and collector of the second transistors $Q_B$ are connected together to ground. In addition to the second transistor $Q_B$, the second portion 320 includes a second resistive element 326. The second resistive element 326 is connected between the second node B and ground, and has the same resistance $R_2$ as the second resistive element 316 in the first portion 310.

In the second portion 320, the second node B receives a second current 321 having the same magnitude I as the first current 311. The second current 321 is divided at the second node B into a first branch current 323 and a second branch current 325. The first branch current 323 and the second branch current 325 flow towards the second transistor $Q_B$ and the second resistive element 326, respectively. Since the comparator 302 functions to keep the first node A and the second node B equal potential, and further since the second resistive element 326 has the same resistance $R_2$, the second branch current 325 has the same magnitude $I_2$ as the second branch current 315 in the first portion 310. Consequently, the first branch current 323 flowing into the second transistor $Q_B$ has the same magnitude $I_1$ as the first branch current 313 in the first portion 310.

The output stage 330 includes another transistor $P_1$ and a third resistive element 332. The third resistive element 332 has a resistance $R_3$ and is connected between a node D and ground. The transistor $P_1$, when turned on, conducts a current $I_{REF}$ from Vdd through the node D towards the third resistive element 332. The current $I_{REF}$ has the same magnitude I as the first current 311 and the second current 321. The TCM circuit 300 provides an output voltage $V_{REF}$ at the node D.

The second resistive element 316 of the first portion 310 and the second resistive element 326 of the second portion 320 include variable resistors. The variable resistors facilitate the output voltage $V_{REF}$ to switch between a positive temperature coefficient and a negative temperature coefficient, as will be discussed below.

The first branch current $I_1$ in the first portion 310 can be obtained by applying Kirchhoff's laws and expressed in equation (1) below.

$$I_1 = \frac{V_A - V_{EB1}}{R_1} = \frac{V_B - V_{EB1}}{R_1} = \frac{V_{EB2} - V_{EB1}}{R_1} \qquad \text{equation (1)}$$

where $V_A$ and $V_B$ represent voltage levels at the first node A and the second node B, respectively, and $V_{EB1}$ and $V_{EB2}$ represent emitter-to-base voltages of the first transistors $Q_A$ and the second transistors $Q_B$, respectively. $V_A$ equals $V_B$ by function of the comparator 302.

Moreover, a collector current $I_{C1}$ in each of the first transistors $Q_A$ and a collector current $I_{C2}$ in the second transistors $Q_B$ are expressed below.

$$I_{C1} = I_S\left(e^{\frac{V_{EB1}}{V_T}}\right) \qquad \text{equation (2-1)}$$

$$I_{C2} = I_S\left(e^{\frac{V_{EB2}}{V_T}}\right) \qquad \text{equation (2-2)}$$

where $I_S$ represents the saturation current of the first transistor $Q_A$ and the second transistor $Q_B$, and $V_T$ represents the thermal voltage of the first transistor $Q_A$ and the second transistor $Q_B$.

Since the ratio of the number of first transistors $Q_A$ to the number of second transistor $Q_B$ is N, $I_{C2}$ is substantially N times of $I_{C1}$. Equation (3) below shows the result of dividing $I_{C2}$ by $I_{C1}$.

$$\frac{I_{C2}}{I_{C1}} = e^{\frac{V_{EB2}-V_{EB1}}{V_T}} = N \qquad \text{equation (3)}$$

By taking natural log of both sides, equation (4) is obtained.

$$V_{EB2} - V_{EB1} = V_T \ln tion \qquad (4)$$

Based on equation (4), equation (1) is rewritten as:

$$I_1 = \frac{V_T \ln(N)}{R_1} \qquad \text{equation (5)}$$

The thermal voltage $V_T$ is determined as follows.

$$V_T = \frac{k \times T}{q}$$

where k represents the Boltzmann constant, T represents the absolute temperature, and q represents the magnitude of electrical charge of an electron.

Accordingly, the thermal voltage $V_T$ increases as the temperature T increases, and thus is corresponding to a positive temperature coefficient. In an embodiment, the temperature coefficient of the thermal voltage $V_T$ is approximately 0.075 millivolts (mV) per degree Celsius. Likewise, the first branch current $I_1$ is corresponding to a positive temperature coefficient because $I_1$ increases as the thermal voltage $V_T$ increases.

The second branch current $I_2$ in the first portion 310 can be obtained by applying Kirchhoff's laws and expressed in an equation (6) below.

$$I_2 = \frac{V_A}{R_2} = \frac{V_B}{R_2} = \frac{V_{EB2}}{R_2} \qquad \text{equation (6)}$$

The voltage $V_{EB2}$ decreases as temperature increases, and thus is corresponding to a negative temperature coefficient. In an embodiment, the temperature coefficient corresponding to the voltage $V_{EB2}$ is approximately −0.16 mV per degree Celsius. Likewise, the second branch current $I_2$ is corresponding to a negative temperature coefficient because $I_2$ increases as the voltage $V_{EB2}$ increases.

Based on the equations (5) and (6), the first current I can be calculated below:

$$I = I_1 + I_2 = \frac{V_T \ln(N)}{R_1} + \frac{V_{EB2}}{R_2} = \frac{1}{R_2 \left[ V_{EB2} + \frac{R_2}{R_1} V_T \ln(N) \right]} \qquad \text{equation (7)}$$

Based on equation (7), the output voltage $V_{REF}$ is determined as follows.

$$V_{REF} = I_{REF} \times R_3 = I \times R_3 = \frac{R_3}{R_2 \left[ V_{EB2} + \frac{R_2}{R_1} V_T \ln(N) \right]} \qquad \text{equation (8)}$$

By adjusting the resistance ratios of $R_3/R_2$ and $R_2/R_1$, the output voltage $V_{REF}$ can be corresponding to a positive temperature coefficient (PTC), a negative temperature coefficient (NTC), or a zero temperature coefficient (ZTC). The resistance ratio of $R_2/R_1$ decides the temperature coefficient of the output voltage $V_{REF}$ to be PTC, NTC or ZTC, while the resistance ratio of $R_3/R_2$ decides the magnitude of the output voltage $V_{REF}$. In the case of ZTC, the output voltage $V_{REF}$ can be a sub-bandgap voltage, which facilitates an efficient power management. For example, during the read operation, a controller (not shown) may adjust the resistive elements 316 and 326 to increase the resistance $R_2$ to make the temperature coefficient of the output voltage $V_{REF}$ to be PTC. During the write operation, the controller may adjust the resistive elements 316 and 326 to decrease the resistance $R_2$ to make the temperature coefficient of the output voltage $V_{REF}$ to be NTC.

As compared to some existing approaches that provide a relatively high word line voltage, the TCM circuit 300 of the present disclosure is advantageous in that power consumption on a word line is more efficient and the write efficiency and read efficiency of a memory array are optimized. Further, since the regulated voltage $V_{RWL}$ and thus the word line voltage $V_{WL}$ are not kept at a higher voltage level, voltage stress on the gate oxide of a selected transistor across a wide temperature range can be minimized. Effectively, the impact on a memory with TDDB MOSFETs can be minimized and the reliability of the memory can be enhanced.

In some embodiments of the present disclosure, the resistive elements 316, 326 and 332 are adjustable resistive elements. The resistance $R_2$ of the second resistive elements 316, 326 and the resistance $R_3$ of the third resistive element 332 in the TCM circuit 300 are programmed/adjusted to switch the temperature dependency of the output voltage $V_{REF}$ between PTC and NTC. The second resistive elements 316, 326 and the third resistive element 332 thus serve as variable resistors, as so illustrated in FIG. 3.

Figure 3B:
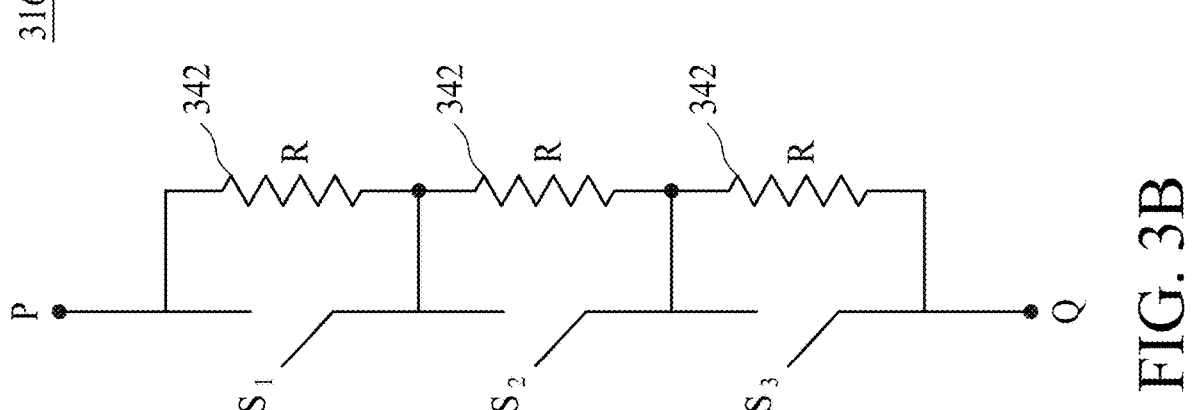
FIG. 3B is a diagram of an exemplary variable resistive element in the TCM circuit shown in FIG. 1, in accordance with some embodiments of the present disclosure.

FIG. 3B is a diagram of an exemplary variable resistive element in the TCM circuit 300 shown in FIG. 1. Referring to FIG. 3B, the variable resistive element, for example, the second resistive element 316, includes multiple resistive elements 342 connected in series between nodes P and Q and controlled by switches $S_1$, $S_2$ and $S_3$. Each of the resistive elements 342 in the present embodiment has a resistance R. In other embodiments, the resistive elements 342 may each have a different resistance. In operation, the more of the switches $S_1$, $S_2$ and $S_3$ are closed, the smaller the resultant resistance between nodes P and Q is provided, and vice versa. For example, if no switches are closed, the resultant resistance between nodes P and Q is 3R. If one of the switches is closed, then the resultant resistance between nodes P and Q is 2R. As a result, during a read operation, a significant number of switches in a variable resistive element are open so as to provide a relatively large resistance. In an embodiment, the ratio of $R_2$ to $R_1$ is approximately 10, which renders a PTC $V_{REF}$ in view of equation (8). In contrast, during a write operation, a significant number of switches in a variable resistive element are closed so as to provide a relatively small resistance. In an embodiment, the ratio of $R_2$ to $R_1$ is approximately 1, which renders an NTC $V_{REF}$.

Figure 4:
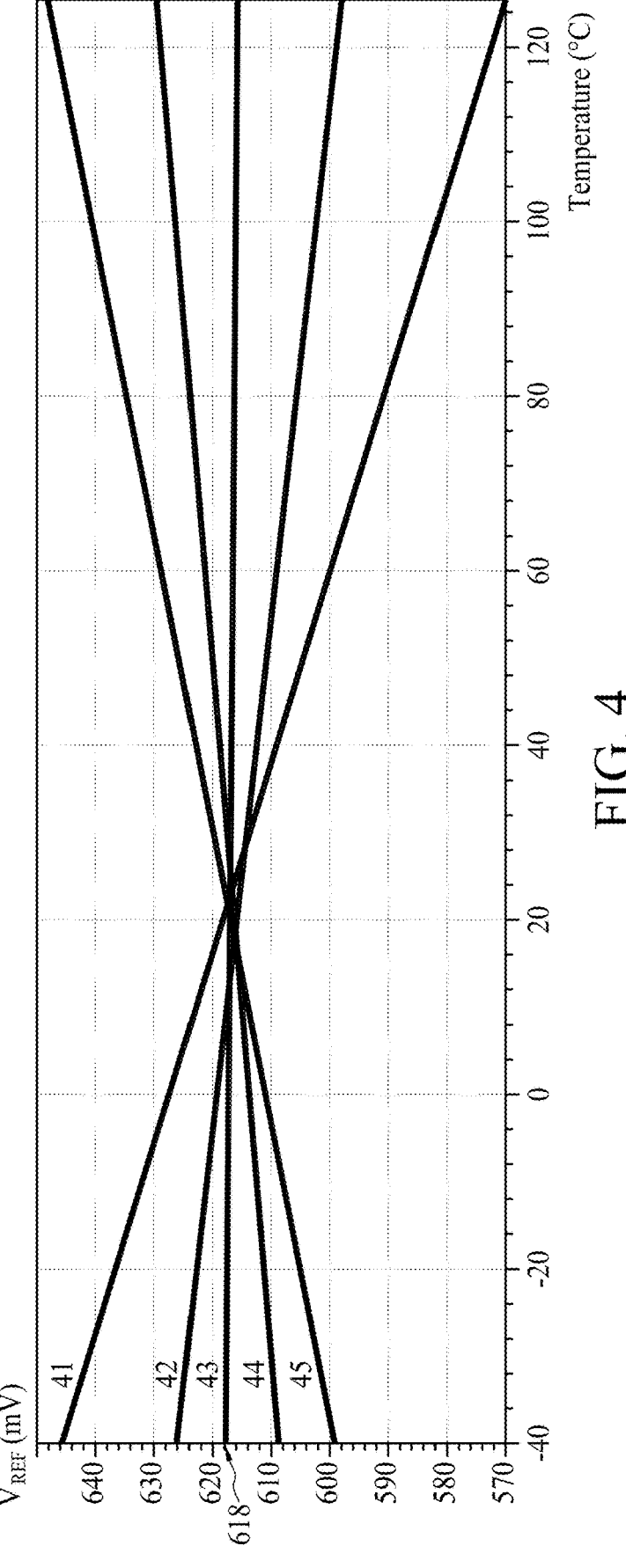
FIG. 4 is a diagram illustrating simulation results of output voltage $V_{REF}$.

FIG. 4 is a diagram illustrating simulation results of output voltage $V_{REF}$. The simulation is conducted by using a Simulation Program with Integrated Circuit (SPICE) simulator. Referring to FIG. 4, lines 41 to 45 show output voltages $V_{REF}$ corresponding to different temperature coefficients at a temperature range from −40° C. to 125° C. The output voltages $V_{REF}$ represented by lines 41, 42, line 43, and lines 44, 45 have NTC, ZTC and PTC, respectively. The simulation results reveal that a desirable output voltage $V_{REF}$ at room temperature is approximately 618 mV.

Figure 5A:
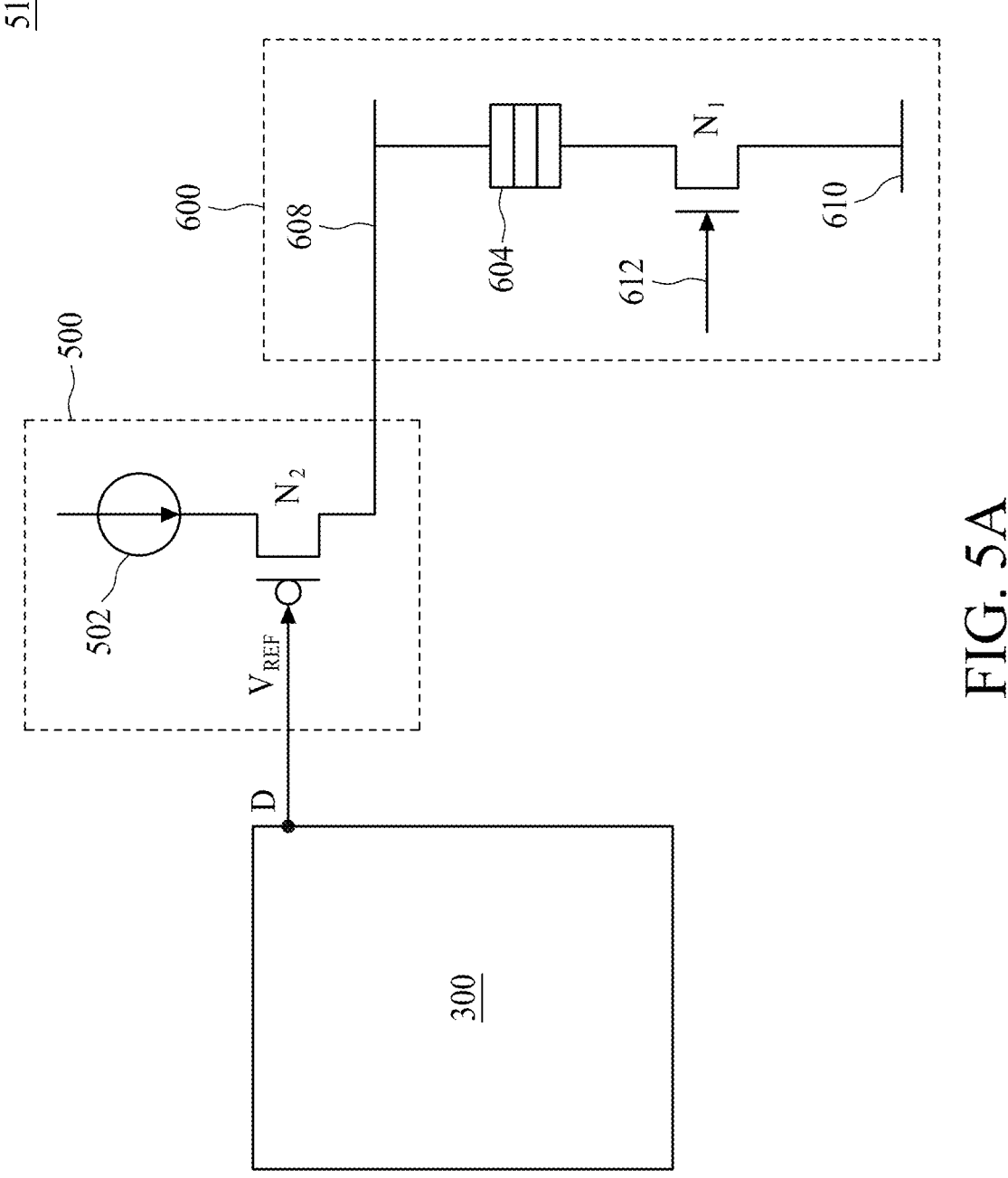
FIGS. 5A and 5B are diagrams of semiconductor devices, in accordance with other embodiments of the present disclosure.
Figure 5B:
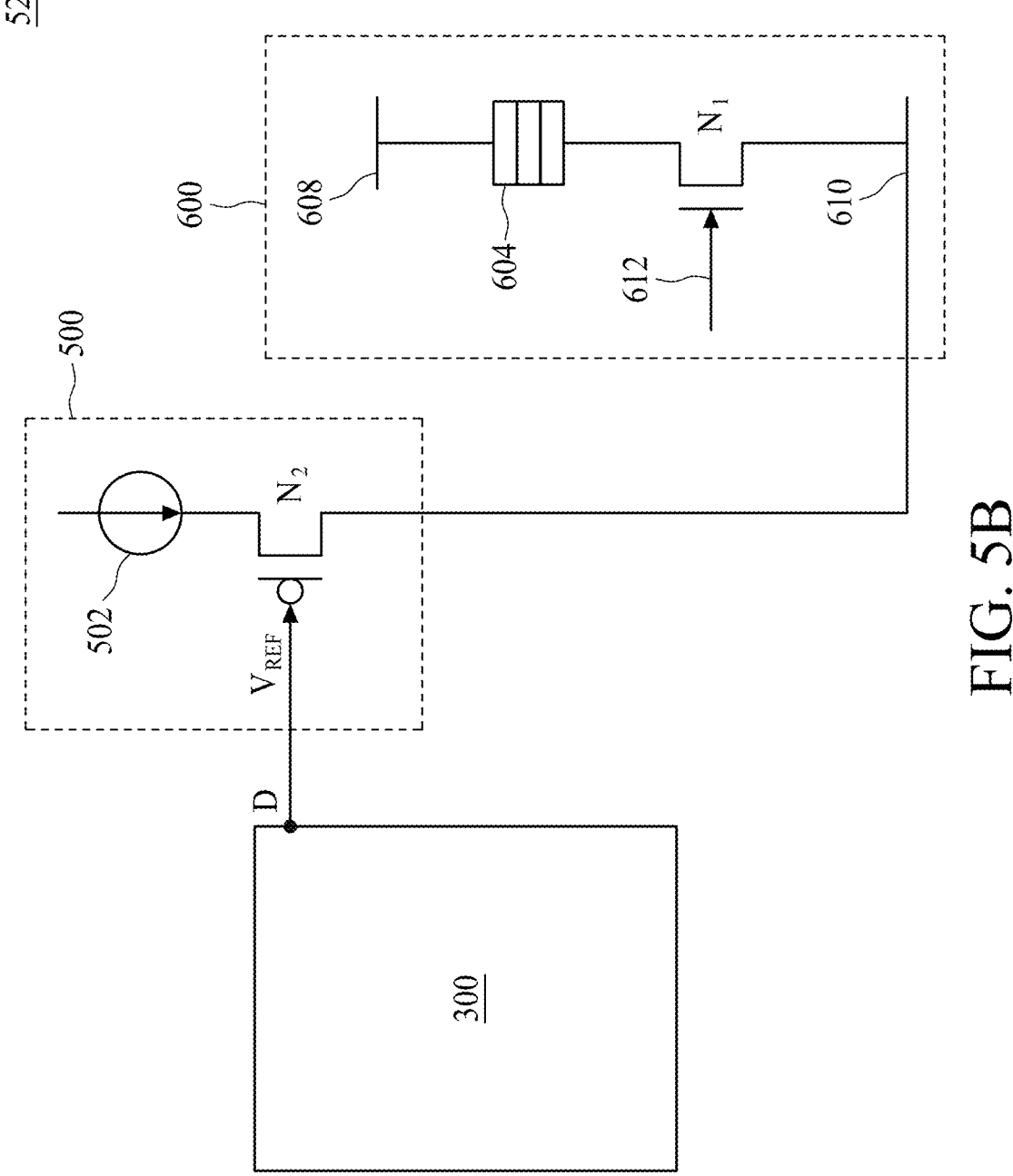

FIGS. 5A and 5B are diagrams of semiconductor devices 51 and 52, respectively, in accordance with other embodiments of the present disclosure. Referring to FIG. 5A, the semiconductor device 51 includes a driving circuit 500 and a memory array 600 in addition the TCM circuit 300.

The driving circuit 500 includes a transistor $N_2$. In the present embodiment, the transistor $N_2$ includes a PMOS transistor. A gate of the transistor $N_2$ receives an output voltage $V_{REF}$. A drain of the transistor $N_2$ is connected to a bit line 608. A source of the transistor $N_2$ receives a current from a current source 502. The output voltage $V_{REF}$ controls a current flowing from the current source 502 through the transistor $N_2$ towards the bit line 608, and thus controls a bit line voltage on the bit line 608.

The memory array 600 includes an MRAM in the present embodiment. For brevity, only a representative MRAM cell is shown. The MRAM cell includes a magnetic tunnel junction (MTJ) 604 and a select transistor $N_1$. The MTJ 604 includes two ferromagnetic layers (a fixed layer and a free layer) separated by a tunneling barrier layer. The free layer is connected to the bit line 608. The select transistor $N_1$ in the present embodiment includes an NMOS transistor. The select transistor $N_1$ may be a PMOS transistor. A gate of the select transistor $N_1$ receives a word line voltage on a word line 612. A drain of the select transistor $N_1$ is connected to the fixed layer of the MTJ 604. A source of the select transistor $N_1$ is connected to a source line 610.

Referring to FIG. 5B, the semiconductor device 52 is similar to the semiconductor device 51 except that, for example, the transistor $N_2$ is an NMOS transistor. The source of the transistor is $N_2$ receives a current from a current source 502. The drain of the transistor $N_2$ is connected to the source line 610. The output voltage $V_{REF}$ controls a current flowing from the current source 502 through the transistor $N_2$ towards the source line 610, and thus controls a source line voltage on the source line 610.

In FIG. 5B, the memory array 600 also includes an MRAM. For brevity, only a representative MRAM cell is shown. The MRAM cell includes a magnetic tunnel junction (MTJ) 604 and a select transistor $N_1$. The MTJ 604 includes two ferromagnetic layers (a fixed layer and a free layer) separated by a tunneling barrier layer. The free layer is connected to the bit line 608. The select transistor $N_1$ in the present embodiment includes an NMOS transistor. The select transistor $N_1$ may be a PMOS transistor. A gate of the select transistor $N_1$ receives a word line voltage on a word line 612. A drain of the select transistor $N_1$ is connected to the fixed layer of the MTJ 604. A source of the select transistor $N_1$ is connected to a source line 610.

In some existing approaches, during a read operation, a constant voltage $V_{READ}$ is applied to one of a bit line or a source line associated with an MRAM cell. During a write operation of writing logic zero (0), a constant voltage $V_{DD}$ is applied to the bit line, and during while a write operation of writing logic one (1), a constant voltage $V_{DD}$ is applied to the source line. Since these constant voltages $V_{READ}$ and $V_{DD}$ are not temperature dependent, such existing approaches are not as efficient in power management as the semiconductor devices 51 and 52 according to the present disclosure.

Figure 6:
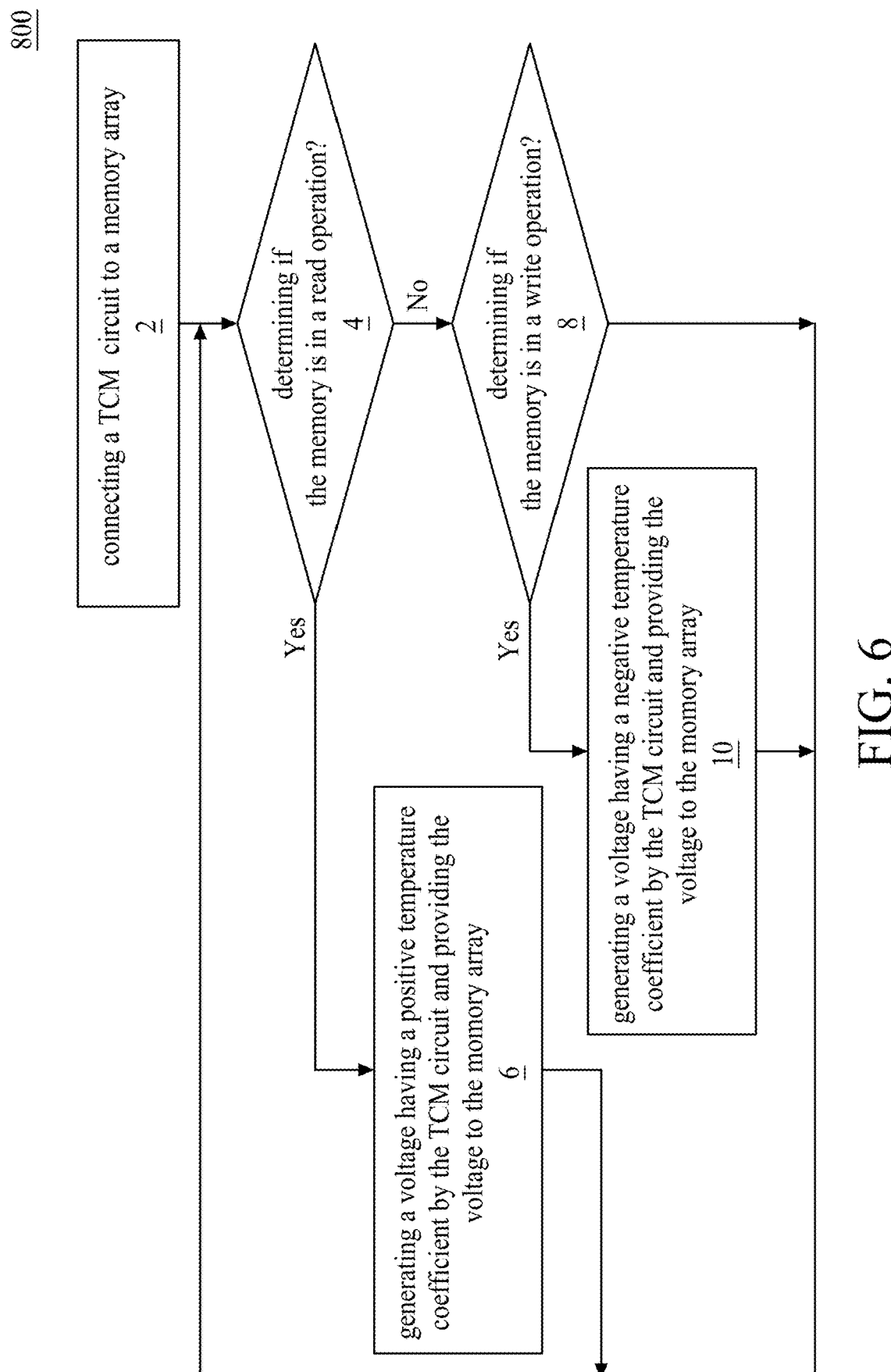
FIG. 6 is a flow diagram showing a method of operating a memory device, in accordance with some embodiments of the present disclosure.

FIG. 6 is a flow diagram 800 showing a method of operating a memory device, in accordance with some embodiments of the present disclosure. The method is configured to switch an output voltage of the TCM circuit between a positive temperature coefficient and a negative temperature coefficient.

Referring to FIG. 6, in operation 2, a TCM circuit is provided. The TCM circuit is connected to a memory array of the memory device. The TCM circuit is configured to generate a temperature-dependent voltage. In an embodiment, the temperature-dependent voltage is provided via a word line to the memory array. In another embodiment, the temperature-dependent voltage is provided via a bit line to the memory array. In yet another embodiment, the temperature-dependent voltage is provided via a source line to the memory array.

In operation 4, it is determined if the memory array operates in a read mode. If affirmative, then in operation 6, a voltage corresponding to a positive temperature coefficient is generated by the TCM circuit and provided to the memory array.

If in operation 4 it is determined that the memory array does not operate in a read mode, then in operation 8, it is further determine if the memory array operates in a write mode. If affirmative, in operation 10 a voltage corresponding to a negative temperature coefficient is generated by the TCM circuit and provided to the memory array. If not, the memory array may be disposed at an idle state, a hold state or operate in a refresh mode.

The memory array may be frequently checked to determine whether it operates in an access mode, that is, a read or a write mode. Therefore, the above-mentioned operations 2, 4, 6, 8 and 10 are repeated when the memory is powered on. Moreover, operations 4 and 8 are exchangeable in sequence.

In an embodiment, the temperature-dependent voltage is generated by flowing a current through a resistive element. The current includes a first component (a first branch current) that is corresponding to a positive temperature coefficient, and a second component (a second branch current) that is corresponding to a negative temperature coefficient. The first branch current flows through a first resistive element having a first resistance. The second branch current flows through a second resistive element having a second resistance. By adjusting a ratio of the second resistance to the first resistance, the temperature-dependent voltage can be switched between a positive temperature coefficient and a negative temperature coefficient.

In some embodiments of the present disclosure, a semiconductor device includes: a memory array including memory cells and a driver; a modulation circuit including a first resistive element, a second resistive element and a third resistive element; a regulator connecting the modulation circuit to the memory array, wherein the regulator includes a transistor; and a controller. The controller is configured to: determine an operation mode of the memory array; cause the regulator to generate a first regulated voltage at a drain terminal of the transistor, wherein the first regulated voltage corresponds to a positive temperature coefficient, a negative temperature coefficient or a zero temperature coefficient according to a first resistance ratio between the first resistive element and the second resistive element and a second resistance ratio between the second resistive element and the third resistive element; during a read operation, cause the driver to provide a first access voltage to the memory cells in response to the first regulated voltage corresponding to the positive temperature coefficient; and during a write operation, cause the driver to provide a second access voltage to the memory cells in response to the first regulated voltage corresponding to the negative temperature coefficient.

In some embodiments of the present disclosure, a semiconductor device includes: a memory array; a regulator connected to the memory array; a modulation circuit configured to generate a temperature-dependent voltage and provide the same to the regulator by adjusting a first adjustable resistive element, a second adjustable resistive element and a third adjustable resistive element of the modulation circuit; and a controller configured to: determine an operation mode of the memory array; cause the modulation circuit to provide a first output voltage to the regulator, the first output voltage corresponding to a positive temperature coefficient in response to the operation mode being a read operation; cause the modulation circuit to provide a second output voltage to the regulator, the second output voltage corresponding to a negative temperature coefficient in response to the operation mode being a write operation; and enable the read operation or the write operation on the memory array through an output current to the memory array according to the first output voltage or the second output voltage, respectively.

In some embodiments of the present disclosure, a semiconductor device includes: a memory array; a regulator connected to the memory array; a modulation circuit including a first portion, a second portion connected to the first portion, and an output stage connected to the first portion and the second portion; and a controller. The controller is configured to: cause the first portion to generate a first current, the first current including a first branch current and a second branch current, the first branch current having a first magnitude, the second branch current having a second magnitude, a first resistive element receiving the first branch current, a second resistive element receiving the second branch current, and the second resistive element being a first adjustable resistive element; cause the second portion to generate a second current, the second current including a first branch current and a second branch current, the first branch current of the second current having the first magnitude, the second branch current of the second current having the second magnitude, a third resistive element receiving the second branch current of the second current, the third resistive element being a second adjustable resistive element; cause the output stage to generate a first output voltage and a second output voltage, the first output voltage corresponding to a positive temperature coefficient, the second output voltage corresponding to a negative temperature coefficient, and the first output voltage and the second output voltage are determined by a first resistance ratio between the first resistive element and the second resistive element and a second resistance ratio between the second resistive element and the third resistive element; and access the memory array by a read current or a write current through the regulator based on the first output voltage or the second output voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A semiconductor device, comprising:
a memory array comprising memory cells and a driver;
a modulation circuit comprising a first resistive element, a second resistive element and a third resistive element;
a regulator connecting the modulation circuit to the memory array, wherein the regulator comprises a transistor; and
a controller configured to:
determine an operation mode of the memory array;
cause the regulator to generate a first regulated voltage at a drain terminal of the transistor, wherein the first regulated voltage corresponds to a positive temperature coefficient, a negative temperature coefficient or a zero temperature coefficient according to a first resistance ratio between the first resistive element and the second resistive element and a second resistance ratio between the second resistive element and the third resistive element;
during a read operation, cause the driver to provide a first access voltage to the memory cells in response to the first regulated voltage corresponding to the positive temperature coefficient; and
during a write operation, cause the driver to provide a second access voltage to the memory cells in response to the first regulated voltage corresponding to the negative temperature coefficient.
2. The semiconductor device of claim 1, wherein the regulator further comprises a comparator and a voltage divider, wherein the voltage divider comprises a tap connected to a first input terminal of the comparator, where the comparator further comprises a second input terminal configured to receive an output voltage of the modulation circuit.
3. The semiconductor device of claim 2, wherein the voltage divider is connected to the drain terminal of the transistor.
4. The semiconductor device of claim 3, wherein the memory array comprises a word line driver configured to receive the first access voltage or the second access voltage of the regulator.
5. The semiconductor device of claim 4, wherein each of the first resistive element, the second resistive element and the third resistive element is a variable resistive element comprising a plurality of resistive elements and a plurality of switches connected to the resistive elements.

6. The semiconductor device of claim 5, wherein the modulation circuit comprises three transistors having their gates connected together and having their drains connected to the first resistive element, the second resistive element, and the third resistive element, respectively.

7. A semiconductor device, comprising:

a memory array;

a regulator connected to the memory array;

a modulation circuit configured to generate a temperature-dependent voltage and provide the same to the regulator by adjusting a first adjustable resistive element, a second adjustable resistive element and a third adjustable resistive element of the modulation circuit; and a controller configured to:

determine an operation mode of the memory array;

cause the modulation circuit to provide a first output voltage to the regulator, the first output voltage corresponding to a positive temperature coefficient in response to the operation mode being a read operation;

cause the modulation circuit to provide a second output voltage to the regulator, the second output voltage corresponding to a negative temperature coefficient in response to the operation mode being a write operation; and enable the read operation or the write operation on the memory array through an output current to the memory array according to the first output voltage or the second output voltage, respectively.

8. The semiconductor device of claim 7, wherein the output current is provided to a word line of the memory array.

9. The semiconductor device of claim 7, wherein the memory array further comprises a word line driver configured to generate the output current according to the first output voltage or the second output voltage to enable the read operation or the write operation.

10. The semiconductor device of claim 7, wherein the regulator comprises a first comparator, a transistor and a voltage divider, wherein the first comparator includes a first input terminal connected to the voltage divider and an output terminal connected to a gate of the transistor.

11. The semiconductor device of claim 10, wherein the first comparator further comprises a second input terminal connected to the modulation circuit.

12. The semiconductor device of claim 7, wherein the modulation circuit further comprises a first transistor, a second transistor and a third transistor each including a drain connected to the first adjustable resistive element, the second adjustable resistive element and the third adjustable resistive element, respectively.

13. The semiconductor device of claim 12, wherein the drain of the first transistor is configured to provide the first output voltage or the second output voltage, and the drains of the second transistor and the third transistor are connected to two input terminals of a second comparator of the modulation circuit.

14. The semiconductor device of claim 13, wherein the first transistor, the second transistor and the third transistor of the modulation circuit having gates connected together.

15. The semiconductor device of claim 14, wherein gates of the second transistor and the third transistor of the modulation circuit are connected to an output terminal of the second comparator.

16. The semiconductor device of claim 12, wherein the first transistor, the second transistor and the third transistor of the modulation circuit having gates connected together.

17. A semiconductor device, comprising:

a memory array;

a regulator connected to the memory array;

a modulation circuit comprising a first portion, a second portion connected to the first portion, and an output stage connected to the first portion and the second portion; and a controller configured to:

cause the first portion to generate a first current, the first current comprising a first branch current and a second branch current, the first branch current having a first magnitude, the second branch current having a second magnitude, a first resistive element receiving the first branch current, a second resistive element receiving the second branch current, and the second resistive element being a first adjustable resistive element;

cause the second portion to generate a second current, the second current comprising a first branch current and a second branch current, the first branch current of the second current having the first magnitude, the second branch current of the second current having the second magnitude, a third resistive element receiving the second branch current of the second current, the third resistive element being a second adjustable resistive element;

cause the output stage to generate a first output voltage and a second output voltage, the first output voltage corresponding to a positive temperature coefficient, the second output voltage corresponding to a negative temperature coefficient, and the first output voltage and the second output voltage are determined by a first resistance ratio between the first resistive element and the second resistive element and a second resistance ratio between the second resistive element and the third resistive element; and access the memory array by a read current or a write current through the regulator based on the first output voltage or the second output voltage.

18. The semiconductor device of claim 17, wherein the first branch current of the first current corresponds to the positive temperature coefficient.

19. The semiconductor device of claim 17, wherein second branch current of the first current corresponds to the negative temperature coefficient.

20. The semiconductor device of claim 17, wherein first branch current of the second current corresponds to the positive temperature coefficient.

* * * * *